US008643357B2

(12) United States Patent
Son et al.

(10) Patent No.: US 8,643,357 B2
(45) Date of Patent: Feb. 4, 2014

(54) INTERNAL VOLTAGE GENERATOR

(75) Inventors: Jong-Ho Son, Gyeonggi-do (KR); Saeng-Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 316 days.

(21) Appl. No.: 12/974,849

(22) Filed: Dec. 21, 2010

(65) Prior Publication Data

US 2011/0234194 A1 Sep. 29, 2011

(30) Foreign Application Priority Data

Mar. 29, 2010 (KR) .................. 10-2010-0027842

(51) Int. Cl.
G05F 5/00 (2006.01)
G05F 1/10 (2006.01)

(52) U.S. Cl.
USPC ........................ 323/299; 327/538; 327/548

(58) Field of Classification Search
USPC ........... 323/318, 299, 303; 327/158, 538, 548
See application file for complete search history.

(56) References Cited

U.S. PATENT DOCUMENTS

| 5,796,293 | A * | 8/1998 | Yoon et al. ............... 327/536 |
| 6,275,096 | B1 * | 8/2001 | Hsu et al. ................ 327/535 |
| 6,278,317 | B1 * | 8/2001 | Hsu et al. ................ 327/536 |
| 6,329,869 | B1 * | 12/2001 | Matano ................... 327/536 |
| 6,580,312 | B1 * | 6/2003 | Kim ....................... 327/536 |
| 6,989,718 | B2 * | 1/2006 | Pretl et al. ............... 331/16 |
| 7,068,111 | B2 * | 6/2006 | Lee ....................... 331/17 |
| 7,177,381 | B2 * | 2/2007 | Kim et al. ................ 375/376 |
| 7,468,628 | B2 * | 12/2008 | Im et al. ................. 327/548 |
| 7,545,203 | B2 * | 6/2009 | Byeon et al. ............. 327/536 |
| 7,602,224 | B2 * | 10/2009 | Lee ....................... 327/158 |
| 2007/0146053 | A1 * | 6/2007 | Lee ....................... 327/536 |
| 2007/0147140 | A1 * | 6/2007 | Byeon et al. ............ 365/189.09 |
| 2007/0236278 | A1 * | 10/2007 | Hur et al. ................ 327/536 |
| 2008/0169865 | A1 * | 7/2008 | Kim ....................... 327/538 |
| 2008/0258801 | A1 * | 10/2008 | Gou ....................... 327/536 |
| 2008/0265861 | A1 * | 10/2008 | Wang ..................... 323/318 |
| 2008/0284475 | A1 * | 11/2008 | Lee ....................... 327/149 |
| 2008/0284486 | A1 * | 11/2008 | Im ........................ 327/333 |

(Continued)

FOREIGN PATENT DOCUMENTS

| KR | 1020090002385 | 1/2009 |
| KR | 1020090046245 | 5/2009 |
| KR | 1020090093307 | 9/2009 |

OTHER PUBLICATIONS

Notice of Preliminary Rejection issued from Korean Intellectual Property Office on Jul. 29, 2011.

(Continued)

*Primary Examiner* — Timothy J Dole
*Assistant Examiner* — Yusef Ahmed
(74) *Attorney, Agent, or Firm* — IP & T Group LLP

(57) ABSTRACT

A internal voltage generator includes a plurality of voltage level detection units, each configured to detect a voltage level of a corresponding internal voltage terminal, based on a predetermined target voltage level assigned to the corresponding internal voltage terminal, and generate a detection signal, a common internal voltage generation unit configured to generate an internal voltage through a pumping operation in response to the detection signal outputted from the voltage level detection units, and a path multiplexing unit configured to selectively output the internal voltage to one of the internal voltage terminals.

16 Claims, 4 Drawing Sheets

(56) References Cited

U.S. PATENT DOCUMENTS

2009/0085677 A1* 4/2009 Lewis ............................ 331/1 A
2009/0167425 A1* 7/2009 Park .............................. 327/548
2009/0302909 A1* 12/2009 Lee ............................... 327/158
2010/0237930 A1* 9/2010 Byeon ........................... 327/536
2010/0320988 A1* 12/2010 Do ................................ 323/284
2011/0001556 A1* 1/2011 Kim .............................. 327/540
2013/0169353 A1* 7/2013 Kim .............................. 327/538

OTHER PUBLICATIONS

Notice of Allowance issued by the Korean Intellectual Property Office on Mar. 26, 2012.

* cited by examiner

US 8,643,357 B2

INTERNAL VOLTAGE GENERATOR

CROSS-REFERENCE TO RELATED APPLICATIONS

The present application claims priority of Korean Patent Application No. 10-2010-0027842, filed on Mar. 29, 2010, which is incorporated herein by reference in its entirety.

BACKGROUND OF THE INVENTION

Exemplary embodiments of the present invention relate to semiconductor design technology, and more particularly, to an internal voltage generator which is capable of generating internal voltages having various levels.

In general, a semiconductor memory device including double data rate synchronous DRAM (DDR SDRAM) receives an external voltage, and generates internal voltages having various levels by using the external voltage. Therefore, the semiconductor memory device includes an internal voltage generator provided therein to generate the internal voltages. When the internal voltages generated by the internal voltage generator are used, it may be possible to guarantee more efficient power consumption and more stable circuit operation.

Meanwhile, the internal voltages may be divided into two kinds depending on generation methods.

First, one type of the internal voltages may be generated by down-converting an external voltage. The first type of the internal voltages includes a core voltage and a peripheral voltage. Second, the other type of internal voltages may be generated by pumping an external voltage. The second type of the internal voltages includes a positive high voltage, a substrate bias voltage, and a negative low voltage.

For reference, the positive high voltage and the negative low voltage are voltages which are applied to a word line used for controlling a memory cell. The positive high voltage is used for enabling a word line, and the negative low voltage is used for disabling a word line. The substrate bias voltage is a voltage which is applied to a well or substrate inside a semiconductor memory device, and used for maintaining a contact surface between the well or substrate and an internal circuit in a reverse-bias state, thereby improving circuit characteristics and preventing malfunction. In general, the target voltage level of the substrate bias voltage VBB may be set to approximately −0.8V, and the target voltage level of the negative low voltage VBBW may be set to approximately −0.2V.

FIG. 1 is a block diagram illustrating a conventional internal voltage generator. In the conventional internal voltage generator, a substrate bias voltage VBB and a negative low voltage VBBW are generated by a pumping operation.

Referring to FIG. 1, the internal voltage generator includes a first internal voltage generation unit 110 configured to generate the substrate bias voltage VBB and a second internal voltage generation unit 120 configured to generate the negative low voltage VBBW. The circuit operation and configuration of the first internal generation unit 110 are similar to those of the second internal generation unit 120. Therefore, the following description focuses on the first internal generation unit 110 which generates the substrate bias voltage VBB.

The first internal voltage generation unit 110 includes a first voltage level detection section 111, a first oscillation section 112, and a first pumping section 113. The first voltage level detection section 111 is configured to detect a voltage level of a substrate bias voltage (VBB) terminal, based on a first reference voltage VREF1 corresponding to a target voltage level of the substrate bias voltage VBB, and generate a first detection signal DET1. The first oscillation section 112 is configured to generate a first oscillation signal OSC1 at a predetermined frequency in response to the first detection signal DET1. The first pumping section 113 is configured to generate the substrate bias voltage VBB through a pumping operation in response to the first oscillation signal OSC1.

The first detection signal DET1 may be a signal having a logic high level or a logic low level. When the substrate bias voltage VBB becomes higher than the target voltage level, the first detection signal DET1 becomes a logic high level to enable the first oscillation section 112. When the substrate bias voltage VBB becomes lower than the target voltage level, the first detection signal DET1 becomes a logic low level to disable the first oscillation section 112. Then, the enabled first oscillation section 112 generates a first oscillation signal OSC1 at a predetermined frequency, and the first pumping section 113 lowers the voltage level of the substrate bias voltage VBB toward the target voltage level through a pumping operation in response to the first oscillation signal OSC1.

Similar to the first internal voltage generation unit 110, the second internal voltage generation unit 120 includes a second voltage level detection section 121, a second oscillation section 122, and a pumping section 123. The second internal voltage generation unit 120 generates a negative low voltage VBBW through the above-described pumping operation. In other words, the second voltage level detection section 121 is configured to detect the voltage level of a negative low voltage (VBBW) terminal, based on a second reference voltage VREF2 corresponding to the target voltage level of the negative low voltage VBBW. The second oscillation section 122 is configured to generate an oscillation signal OSC2 at a predetermined frequency depending on the detection result. The second pumping section 123 is configured to generate the negative low voltage VBBW through a pumping operation in response to the oscillation signal OSC2.

Meanwhile, semiconductor memory devices have been designed to perform a variety of operations. Accordingly, various kinds of internal voltages having different target voltage levels are required. Therefore, in order to generate internal voltages other than the substrate bias voltage VBB and the negative low voltage VBBW, various units such as the first and second internal voltage generation units 110 and 120 of FIG. 1 may be additionally needed. In a semiconductor memory device of which the chip size is limited, such additional units may increase the burden in the semiconductor memory device design.

SUMMARY OF THE INVENTION

An exemplary embodiment of the present invention is directed to an internal voltage generator which is capable of generating a plurality of internal voltages having different target voltage levels using shared circuitry.

In accordance with an exemplary embodiment of the present invention, an internal voltage generator includes a plurality of voltage level detection units, each configured to detect a voltage level of a corresponding internal voltage terminal, based on a predetermined target voltage level assigned to the corresponding internal voltage terminal, and generate a detection signal, a common internal voltage generation unit configured to generate an internal voltage through a pumping operation in response to the detection signals outputted from the voltage level detection units, and a path multiplexing unit configured to selectively output the internal voltage to one of the internal voltage terminals.

In accordance with another exemplary embodiment of the present invention, an internal voltage generator includes a plurality of voltage level detection units, each configured to detect a voltage level of a corresponding internal voltage terminal, based on a predetermined target voltage level assigned to the corresponding internal voltage terminal, and generate a detection signal, a common oscillation unit configured to generate an oscillation signal of which frequency is varied depending on the detection signals, and a common pumping unit configured to generate an internal voltage through a pumping operation in response to the oscillation signal.

DESCRIPTION OF SPECIFIC EMBODIMENTS

Figure 1:
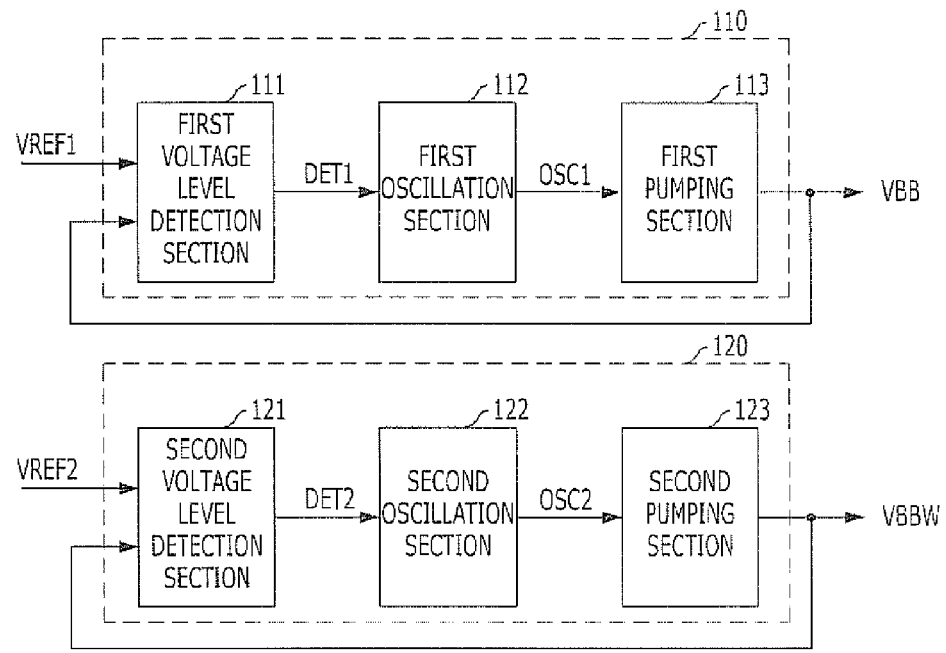
FIG. 1 is a block diagram illustrating a conventional internal voltage generator.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
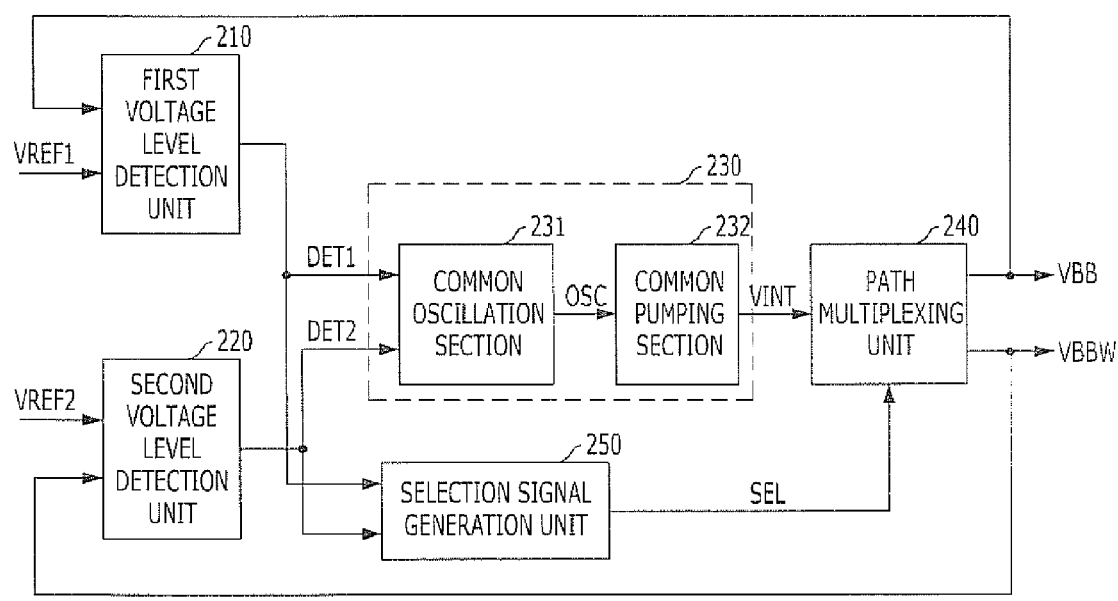
FIG. 2 is a block diagram showing an internal voltage generator in accordance with a first exemplary embodiment of the present invention.

FIG. 2 is a block diagram showing an internal voltage generator in accordance with a first exemplary embodiment of the present invention. For the purpose of illustration, a case, where a substrate bias voltage VBB and a negative low voltage VBBW are generated in the same manner as in the conventional internal voltage generator, will be taken as an example.

Referring to FIG. 2, the internal voltage generator in accordance with the first exemplary embodiment of the present invention includes first and second voltage level detection units 210 and 220, a common internal voltage generation unit 230, a path multiplexing unit 240, and a selection signal generation unit 250.

The first voltage level detection unit 210 is configured to detect the voltage level of a substrate bias voltage (VBB) terminal, based on a first reference voltage VREF1 corresponding to a target voltage level of a substrate bias voltage VBB, and generate a first detection signal DET1. The second voltage level detection unit 220 is configured to detect the voltage level of a negative low voltage (VBBW) terminal, based on a second reference voltage VREF2 corresponding to a target voltage level of a negative low voltage VBBW. Here, the first and second reference voltages VREF1 and VREF2 have voltage levels corresponding to different target voltage levels.

The common internal voltage generation unit 230 is configured to generate an internal voltage VINT through a pumping operation in response to one of the first and second detection signals DET1 and DET2, and include a common oscillation section 231 and a common pumping section 232. The common oscillation section 231 is configured to generate an oscillation signal OCS at a predetermined frequency in response to one of the first and second detection signals DET1 and DET2, and the common pumping section 232 is configured to generate an internal voltage VINT through a pumping operation in response to the oscillation signal OSC. As described below, the common internal voltage generation unit 230 performs a pumping operation in response to any one of the first and second detection signals DET1 and DET2.

Though it is not shown, the common internal voltage generation unit 230 further comprises a combining block for combining the first and second detection signals DET1 and DET2 to output the combined result to the common oscillation section 231. The combining block may be implemented with an OR gate for receiving the first and second detection signals DET1 and DET2.

The path multiplexing unit 240 is configured to multiplex an output path of the internal voltage VINT in response to a selection signal SEL, and the internal voltage VINT generated by the common internal voltage generation unit 230 is outputted to the substrate bias voltage (VBB) terminal or the negative low voltage (VBBW) terminal according to the selection signal SEL. The selection signal generation unit 250 is configured to generate the selection signal SEL in response to one of the first and second detection signals DET1 and DET2. Here, for example, the logic level of the selection signal SEL is decided according to the logic level of one of the first and second detection signals DET1 and DET2.

Figure 3:
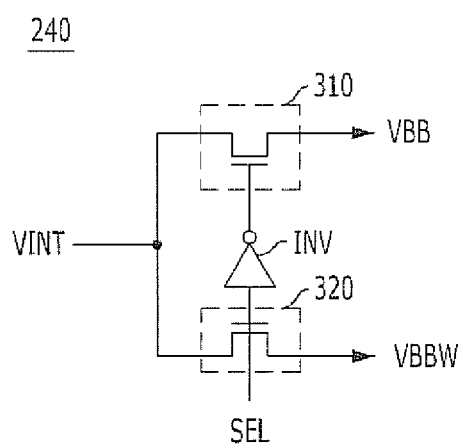
FIG. 3 is a circuit diagram demonstrating a path multiplexing unit shown in FIG. 2.

FIG. 3 is a circuit diagram demonstrating the path multiplexing unit 240 shown in FIG. 2.

Referring to FIG. 3, the path multiplexing unit 240 includes a first output section 310 and a second output section 320. The first output section 310 is configured to output the internal voltage VINT as a substrate bias voltage VBB in response to the selection signal SEL, and the second output section 320 is configured to output the internal voltage VINT as a negative low voltage VBBW in response to the selection signal SEL. Here, when the selection signal SEL is a logic low level, the internal voltage VINT is outputted as the substrate bias voltage VBB. When the selection signal SEL is a logic high level, the internal voltage VINT is outputted as the negative low voltage VBBW.

Referring to FIGS. 2 and 3, a circuit operation of the internal voltage generator in accordance with the first exemplary embodiment of the present invention will be described.

First, when the substrate bias voltage VBB is higher than the first reference voltage corresponding to a target voltage level (hereinafter, referred to as 'first target voltage level'), the first detection signal DET1 becomes a logic high level, and the common internal voltage generation unit 230 generates an internal voltage VINT corresponding to the first target voltage level through a pumping operation in response to the first detection signal DET1. At this time, the selection signal generation unit 250 generates a logic low level selection signal SEL in response to the first detection signal DET1, and the path multiplexing unit 240 outputs the internal voltage VINT as a substrate bias voltage VBB in response to the selection signal SEL. Such a series of operations are performed until the substrate bias voltage VBB reaches the first target voltage level.

When the negative low voltage VBBW is higher than the second reference voltage VREF2 corresponding to a target voltage level (hereinafter, referred to as 'second target voltage level'), the second detection signal DET2 becomes a logic high level, and the first detection signal DET1 becomes a logic low level. The common internal voltage generation unit 230 generates an internal voltage VINT corresponding to the second target voltage level through a pumping operation in response to the second detection signal DET2. At this time, the selection signal generation unit 250 generates a logic high level selection signal SEL in response to the second detection signal DET2, and the path multiplexing unit 240 outputs the internal voltage VINT as a negative low voltage VBBW in response to the selection signal SEL. Such a series of operations are performed until the negative low voltage VBBW reaches the second target voltage level.

Meanwhile, the selection signal generation unit 250 may be configured in various manners depending on the circuit design. When the pumping operation needs to be performed for the substrate bias voltage VBB and the negative low voltage VBBW in the same time range, the selection signal generation unit 250 may generate a selection signal SEL so that by using the selection signal SEL, any one internal voltage of the substrate bias voltage VBB and the negative low voltage VBBW is first generated in response to a corresponding one of the first and second detection signals DET1 and DET2 which is activated. For example, when a substrate bias voltage VBB of −0.8V is first generated, a negative low voltage VBBW of −0.2V may be generated without an additional pumping operation. When a negative low voltage VBBW of −0.2V is first generated, a substrate bias voltage VBB of −0.8V may be generated more quickly by using the negative low voltage VBBW.

The internal voltage generator in accordance with the first exemplary embodiment of the present invention commonly uses the common internal voltage generation unit 230 to generate the substrate bias voltage VBB and the negative low voltage VBBW corresponding to the first and second target voltage levels, respectively. Therefore, it may be possible to minimize the circuit configuration for generating the substrate bias voltage VBB and the negative low voltage VBBW.

Figure 4:
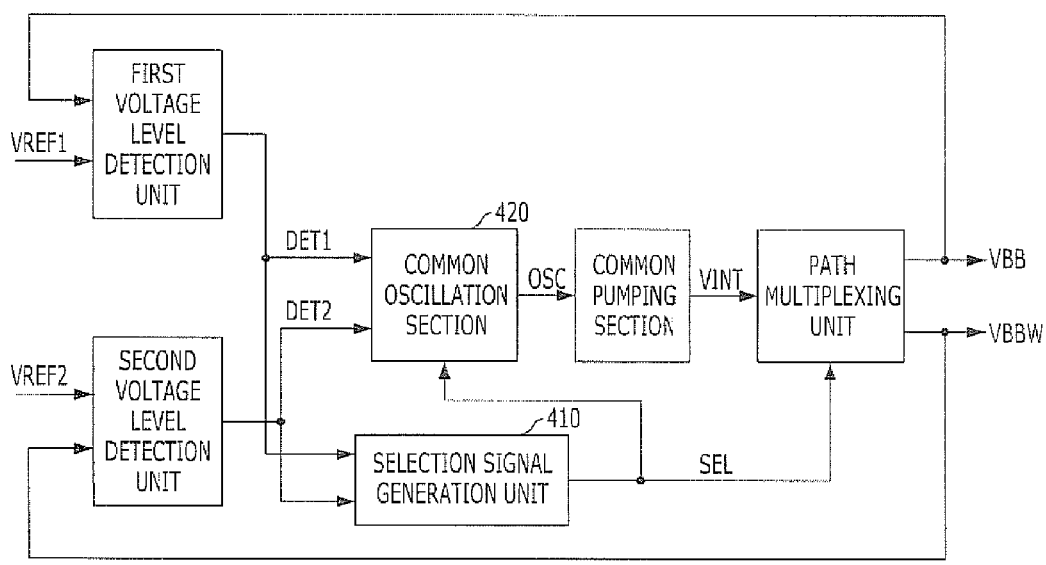
FIG. 4 is a block diagram depicting an internal voltage generator in accordance with a second exemplary embodiment of the present invention.

FIG. 4 is a block diagram depicting an internal voltage generator in accordance with a second exemplary embodiment of the present invention. For the purpose of illustration, the following description focuses on different components from those of the first exemplary embodiment of the present invention.

In the internal voltage generator in accordance with the second exemplary embodiment of the present invention as illustrated in FIG. 4, a selection signal SEL generated by a selection signal generation unit 410 is inputted to a common oscillation section 420, as is different from the case in the internal voltage generator 230 shown in FIG. 1. Here, the selection signal generation unit 410 is configured to generate a selection signal SEL which is activated in response to one of the first and second detection signals DET1 and DET2, and the common oscillation section 420 is configured to generate an oscillation signal OSC at a frequency corresponding to the selection signal SEL. In other words, the common oscillation section 420 generates an oscillation signal OSC of which frequency is varied depending on the first and second detection signals DET1 and DET2, and the oscillation signal OSC generated in such a manner has a frequency corresponding to a substrate bias voltage VBB or a negative low voltage VBBW.

Figure 5:
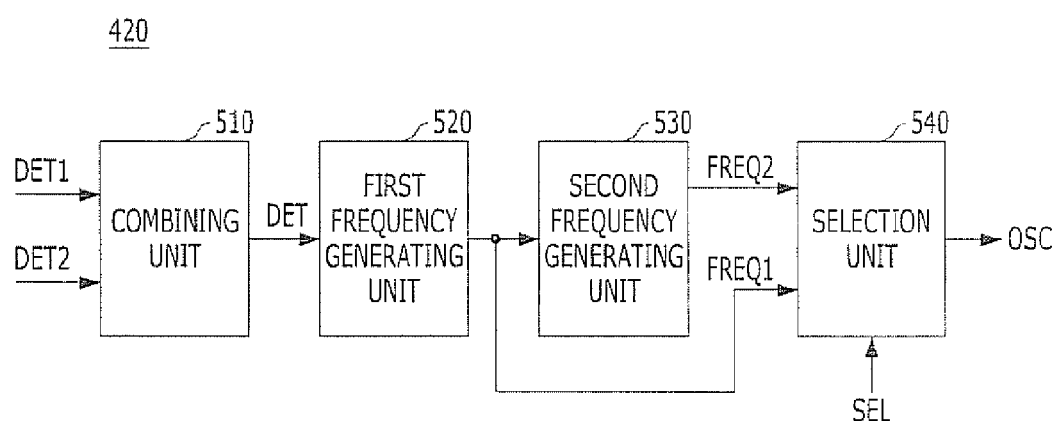
FIG. 5 is a block diagram depicting a common oscillation section shown in FIG. 4.

FIG. 5 is a block diagram depicting the common oscillation section 420 shown in FIG. 4.

Referring to FIG. 5, the common oscillation section 420 comprises a combining block 510, first and second frequency generating units 520 and 530, and a selection unit 540.

The combining block 510 is configured to combine the first and second detection signals DET1 and DET2 to output a combined signal DET to the first frequency generating unit 520. The combining block 510 may be implemented with an OR gate for receiving the first and second detection signals DET1 and DET2.

The first frequency generating unit 520 is configured to generate a first frequency FREQ1 corresponding to the negative low voltage VBBW. The second frequency generating unit 530 is configured to generate a second frequency FREQ2 corresponding to the substrate bias voltage VBB. Here, though it is not shown, the second frequency generating unit 530 may be turned on/off in response to the selection signal SEL.

The selection unit 540 is configured to output the oscillation signal OSC by selecting one of the first and second frequencies FREQ1 and FREQ2 in response to the selection signal SEL.

Accordingly, the common oscillation section 420 may generates the oscillation signal OSC of which frequency is varied depending on the first and second detection signals DET1 and DET2.

The internal voltage generator in accordance with the second exemplary embodiment of the present invention may vary the frequency of the oscillation signal OSC outputted by the common oscillation section 420 in correspondence to the substrate bias voltage VBB and the negative low voltage VBBW, when generating the substrate bias voltage VBB and the negative low voltage VBBW. This means that the operation efficiency for generating the substrate bias voltage VBB and the negative low voltage VBBW may be increased. Furthermore, power consumed for generating the substrate bias voltage VBB and the negative low voltage VBBW may be minimized.

As described above, the internal voltage generator in accordance with the exemplary embodiments of the present invention commonly uses a part of the configuration used for generating a plurality of internal voltages, thereby minimizing the size of the internal voltage generator.

While the present invention has been described with respect to the specific embodiments, it will be apparent to those skilled in the art that various changes and modifications may be made without departing from the spirit and scope of the invention as defined in the following claims.

What is claimed is:

1. An internal voltage generator comprising:
a plurality of voltage level detection units, wherein each of the voltage level detection units is coupled to a corresponding one of a plurality of internal voltage terminals which are different from each other, detects a voltage level of the corresponding internal voltage terminal, based on a corresponding predetermined target voltage level assigned to the corresponding internal voltage terminal, and generates a corresponding detection signal;
a common internal voltage generation unit configured to generate an internal voltage through a pumping operation in response to the respective detection signals outputted from the voltage level detection units; and
a path multiplexing unit configured to selectively output the internal voltage to one of the internal voltage terminals.

2. The internal voltage generator of claim 1, wherein the common internal voltage generation unit performs the pumping operation in response to any one of the detection signals outputted from the voltage level detection units.

3. The internal voltage generator of claim 1, further comprising a selection signal generation unit configured to generate a selection signal in response to the detection signals, wherein the path multiplexing unit selectively outputs the internal voltage to a corresponding one of the internal voltage terminals in response to the selection signal.

4. The internal voltage generator of claim 3, wherein the path multiplexing unit comprises a plurality of output sections configured to selectively output the internal voltage through the corresponding internal voltage terminal in response to the selection signal.

5. The internal voltage generator of claim 1, wherein the selection signal is activated in response to any one of the detection signals.

6. The internal voltage generator of claim 1, wherein the common internal voltage generation unit comprises:
a common oscillation section configured to generate an oscillation signal at a predetermined frequency in response to one of the detection signals outputted from the voltage level detection units; and
a common pumping section configured to generate the internal voltage through a pumping operation in response to the oscillation signal.

7. The internal voltage generator of claim 6, wherein the common internal voltage generation unit further comprises a combining block for combining the detection signals to output the combined result to the common oscillation section.

8. The internal voltage generator of claim 7, wherein the combining block is implemented with an OR gate for receiving the detection signals.

9. An internal voltage generator comprising:
a plurality of voltage level detection units, wherein each of the voltage level detection units is coupled to a corresponding one of a plurality of internal voltage terminals which are different from each other, detects the corresponding internal voltage terminal, based on a corresponding predetermined target voltage level assigned to the corresponding internal voltage terminal, and generates a corresponding detection signal;
a common oscillation unit configured to generate an oscillation signal of which frequency is varied depending on the respective detection signals; and
a common pumping unit configured to generate an internal voltage through a pumping operation in response to the oscillation signal.

10. The internal voltage generator of claim 9, further comprising a path multiplexing unit configured to selectively output the internal voltage to a corresponding internal voltage terminal according to the detection signals.

11. The internal voltage generator of claim 10, wherein the path multiplexing unit comprises a plurality of output sections configured to selectively output the internal voltage through the corresponding internal voltage terminal in response to the selection signal.

12. The internal voltage generator of claim 9, wherein the common oscillation unit performs a pumping operation in response to any one of the detection signals outputted from the voltage level detection units.

13. The internal voltage generator of claim 9, further comprising a selection signal generation unit configured to generate a selection signal for selecting a frequency of the common oscillation unit in response to the detection signals.

14. The internal voltage generator of claim 13, wherein the common oscillation unit comprises:
a combining block configured to combine the detection signals;
a plurality of frequency generating units, each generating a frequency corresponding to the predetermined target voltage level assigned to the corresponding internal voltage terminal; and
a selection unit configured to output the oscillation signal by selecting one of the frequencies in response to the selection signal.

15. The internal voltage generator of claim 14, wherein the combining block is implemented with an OR gate for receiving the detection signals.

16. The internal voltage generator of claim 13, wherein the selection signal is activated in correspondence to any one of the detection signals.

* * * * *